United States Patent [19]

King et al.

[11] 3,871,014

[45] Mar. 11, 1975

[54] FLIP CHIP MODULE WITH NON-UNIFORM SOLDER WETTABLE AREAS ON THE SUBSTRATE

[75] Inventors: William J. King, Poughkeepsie; David L. Wilcox, Hopewell Junction, both of N.Y.

[73] Assignee: International Business Machines Corporation, Armonk, N.Y.

[22] Filed: Aug. 14, 1969

[21] Appl. No.: 850,093

[52] U.S. Cl. ........................ 357/67, 357/65, 357/71, 29/588, 29/589

[51] Int. Cl. ............................ H01l 3/00, H01l 5/00

[58] Field of Search ......... 317/234, 235, 5, 5.3, 5.2, 317/5.4; 29/587, 588, 589, 590, 578, 591, 626

[56] References Cited

UNITED STATES PATENTS

| | | | |
|---|---|---|---|
| 3,380,155 | 4/1968 | Burks | 317/234 X |
| 3,429,040 | 2/1969 | Miller | 317/234 X |
| 3,436,818 | 4/1969 | Merrin et al. | 317/234 X |
| 3,458,925 | 8/1969 | Napier et al. | 317/234 X |
| 3,470,611 | 10/1969 | Mciver et al. | 317/234 X |
| 3,486,223 | 12/1969 | Butera | 317/234 X |
| 3,488,840 | 1/1970 | Hymes et al. | 317/235 X |

OTHER PUBLICATIONS

Bumps and Balls, Pillers and Beams, by G. Sideris; Electronics June 28, 1965, pages 68 and 69.

*Primary Examiner*—Andrew J. James
*Attorney, Agent, or Firm*—John F. Osterndorf; Daniel E. Igo

[57] ABSTRACT

The interconnecting joints between a semiconductor chip and a substrate are non-uniform in shape. The joints are solder and have varying shapes due to varying sizes of the solder wettable regions on the substrate. Smaller solder wettable regions cause the solder connectors to increase chip substrate standoff thereby relieving the stress on the remaining joints.

8 Claims, 6 Drawing Figures

PATENTED MAR 11 1975

3,871,014

INVENTORS
WILLIAM J. KING
DAVID L. WILCOX
BY Sughrue, Rothwell, Mion, Zinn & Macpeak
ATTORNEYS

FLIP CHIP MODULE WITH NON-UNIFORM SOLDER WETTABLE AREAS ON THE SUBSTRATE

BACKGROUND OF THE INVENTION

1. Field of the Invention

The invention is in the field of chip substrate interconnections.

2. Description of the Prior Art

Present day technology has advanced to the state wherein multiple circuit elements interconnected to form multiple circuits can be formed in a single semiconductor chip of extremely small size, e.g., 25 × 25 mils. The circuit elements may be passive, such as resistors and capacitors, or active, such as transistors or diodes, and may be formed by known techniques such as impurity diffusion, epitaxial growth, etc.

Whether an individual chip contains one transistor or hundreds of elements, some means must be provided for connecting the elements on the chip to the outside world, e.g., other chips, power supply lines, etc. One well known techique comprises connecting the chip by interconnector joints to a substrate having a metallization pattern, e.g., conductive fingers, thereon. The conductive fingers extend to the edge of the substrate for connection to a larger connector board, e.g., mother board, which may accommodate many chips.

Electrical connection between the contact areas on the chip face, hereinafter sometimes referred to as BLM or ball limiting metallization, and corresponding contact areas on the substrate is provided by the connector joints. The joints also serve the mechanical function of supporting the chip and thereby separating the chip surface having the BLM areas from the substrate surface. In the absence of separation, the conductive pattern on the substrate would shunt out some of the elements in the chip.

Rigid joints such as copper balls have been used, but their rigidity, while an advantage in maintaining standoff between chip and substrate, is a disadvantage from the standpoint of fatigue. A typical use of chip/substrate modules is in machines such as computers. The temperature changes between on and off states of the machine and the differences in thermal coefficients of expansion between the chip and substrate cause a shear stress to be placed on the connector joints. The thermal cycling causes fatigue and a fracture in the connector joint impairs the electrical connection and may disable an entire machine. The rigidity of the copper balls makes them more susceptible to fracture resulting from shear stresses than solder joints.

Ductile solder connectors provide greater resistance to stress because of their flexibility but were not originally thought to be satisfactory because of collapse during the heat-joining step.

A method of using ductile solder as connector joints wherein the solder joints do not collapse during the heat joining step is disclosed in U.S. Pat. No. 3,429,040 in the name of Lewis F. Miller, issued Feb. 25, 1969 and assigned to the assignee of the present invention. As pointed out in the Miller patent, the wettable (with solder) area of the conductive fingers on the substrate is limited in size and surrounded by non-wettable material. The result is that the solder, when molten during the heat-joining step, is confined on the substrate to the wettable portion of the finger and due to surface tension maintains a shape which supports the chip above the substrate.

U.S. Pat. No. 3,436,818 issued Apr. 8, 1969 to Merrin, et al., and assigned to the assignee of the present application points out that collapse of the solder ball during heat-joining is also prevented if the conductive finger on the substrate is only partially wettable with solder. As described in the Merrin, et al., patent, the solder is placed on the BLM of the chip and heated, thereby assuming a hemispherical shape. The chip is placed face down on the substrate with the solder contacting the finger conductors at the proper designated position. The device is re-heated to cause joining of the solder pad to the fingers at the contact points. The flow of the solder is retarded by the partial wettability of the fingers, and because of this and surface tension the solder maintains a shape sufficient to support the chip.

Examples of solders and conductive materials for forming the ball limiting metallization on the chip and the fingers on the substrate are given in the above-mentioned Miller and Merrin, et al., patents. Also, conductive materials which are wettable, partially wettable, and non-wettable with solder are mentioned.

The ability to prevent solder from collapsing during the heat joining step has provided the chip connector art with connectors that provide good electrical and mechanical connections, maintain standoff, and are relatively flexible and therefore able to withstand greater stress than rigid pads. Notwithstanding the usefulness of ductible solder balls or pads in the chip/substrate connector art, they are still subject to fracture caused by thermal cycling.

SUMMARY OF THE PRESENT INVENTION

In accordance with the present invention, the life of a chip substrate module is increased by increasing the ability of at least some of the connector joints to withstand shear stress. The interconnection joints are designed so that not all are identical on the same chip. The differences, which can be differences in geometry or material, result in the connectors having different abilities to withstand stress. Those having the lesser ability to withstand stress are positioned at points of relatively low stress or serve as non-electrically active dummy points. In the latter case, they serve only a mechanical function and a fracture causing electrical conductivity impairment is of no consequence. Specifically, the chip-substrate module of the present invention is provided with different shaped solder connector joints. The difference in shape is brought about by a difference in size of the solder wettable areas on the substrate.

Figures 4A, 4B:
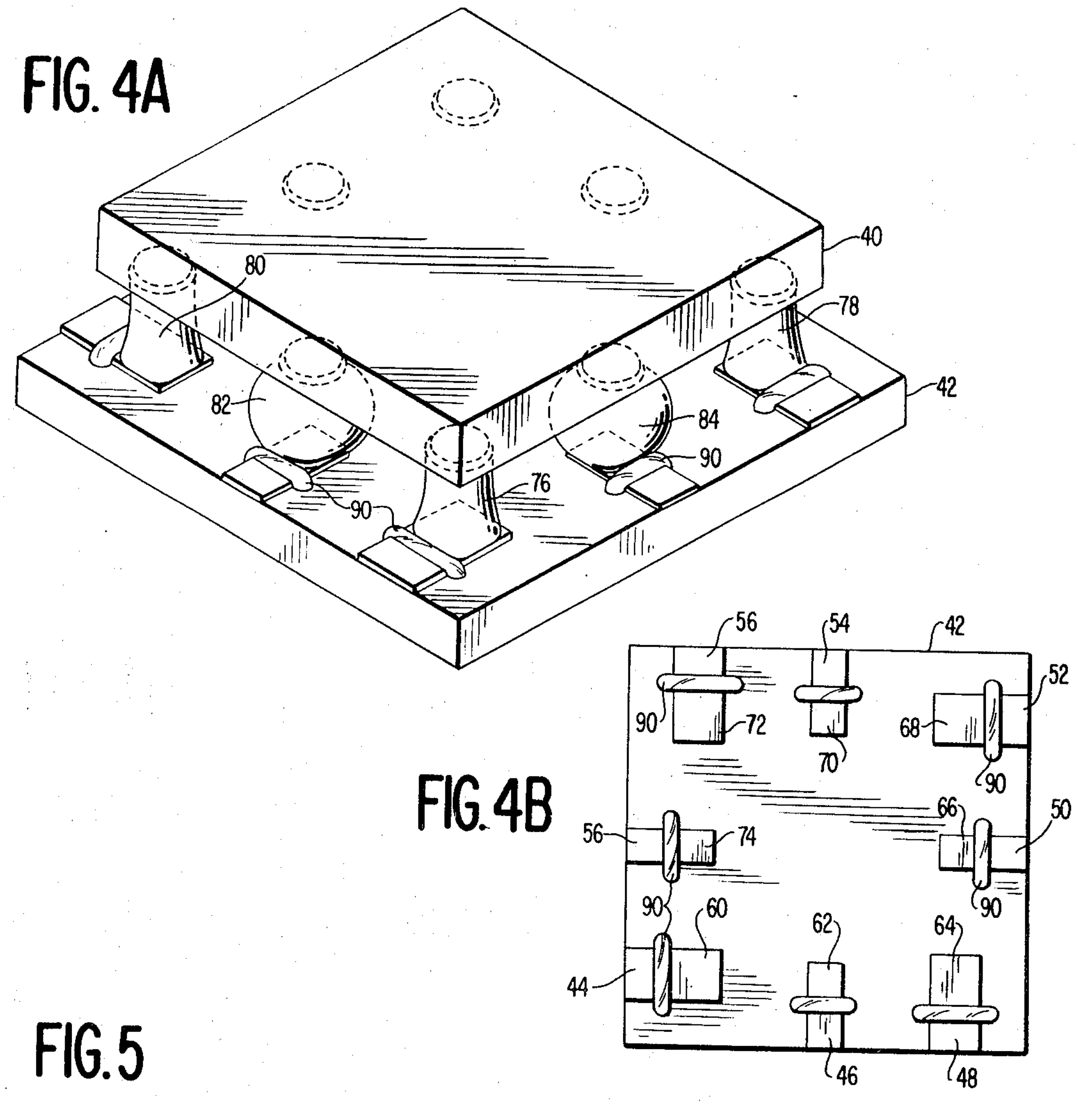

FIG. **4*a*** is a planned view of a chip substrate module in which the solder wettable regions on the substrate are not of uniform size;

FIG. **4*b* is a top view of the substrate of FIG. 4*a*;** and

Figure 5:
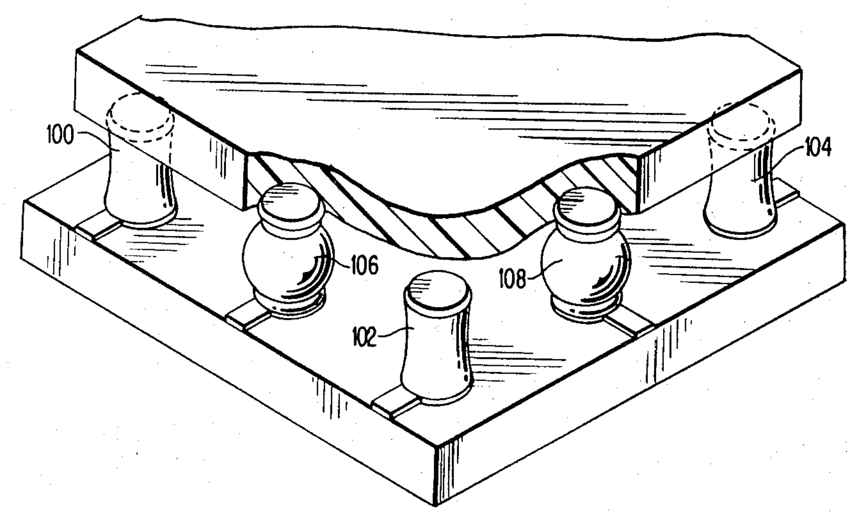

FIG. 5 is a planned view of a chip substrate module having solder and copper ball connector joints.

Figure 1:
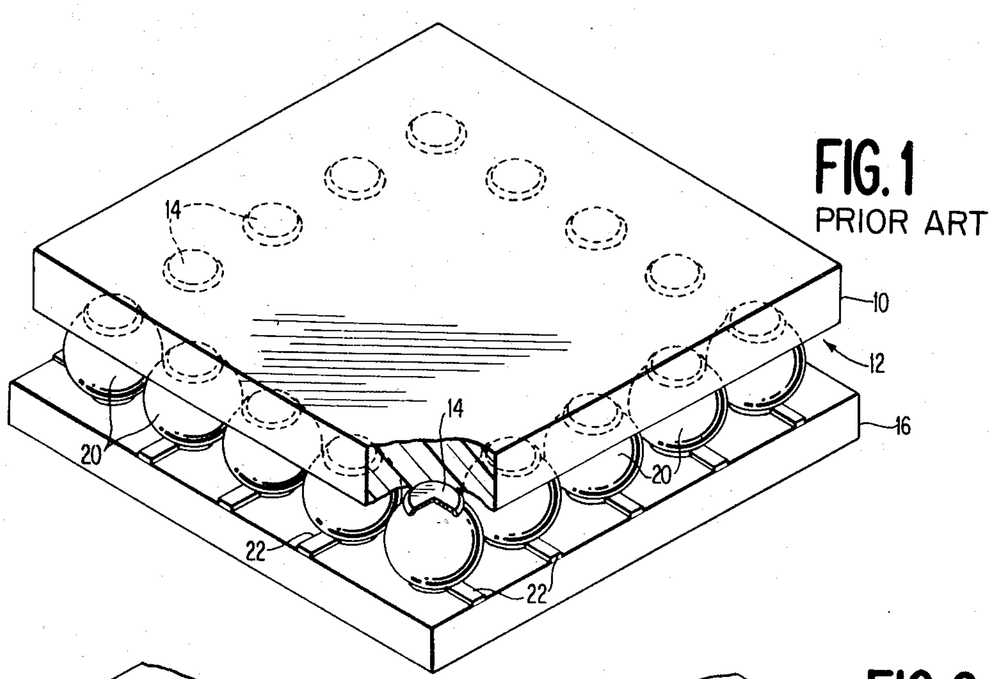
FIG. 1 represents a prior art chip substrate module in which the connector joints are uniform.

FIG. 1 shows an example of a prior art flip chip connection using flexible solder balls. The chip 10 typically is a semiconductor material having passive and/or active circuit elements formed therein by known techniques. The surface 12 is typically covered by a passivating layer which is a good electrical insulator, and external electrical connections are made through the insulating layer to the active and passive devices by metallization areas 14 commonly referred to as ball limiting metallization or BLM.

The chip is mechanically and electrically connected to the substrate 16 by interconnecting means 20 which, in the case described herein, are solder joints. Electrically conductive fingers 22 on the substrate surface complete the electrical connection between chip and substrate. The method for forming the interconnection between chip and substrate is well known in the art and will not be discussed in detail herein, except to say that during the forming process, the module is heated sufficiently to cause the solder to melt and that the solder wettable area of the fingers 22 is limited to prevent the solder from flowing to an extent which will cause collapse of the chip on the substrate. The substrate itself is an insulator, usually a ceramic, and is not wettable with solder. Those portions of the fingers 22 which are to be closed off from the solder can be made of an electrically conductive metal which is not wettable with solder whereas the finger portion to be connected to the solder will be made of a material which is wettable with solder. Alternatively, the entire finger could be made from the same solder-wettable metal and the contact area confined by a glass dam which crosses the finger thereby preventing solder flow past the dam but not impairing the electrical conductivity between the solder contact area of the finger and the other area of the finger. Also, the contact metallization on the substrate may come up through the substrate rather than extend to the edge as shown in FIG. 1. In such a case, the substrate itself will completely surround the contact area and the non-wettableness of the substrate will act as a complete barrier to the flow of the solder.

The shape which the solder interconnections take on during the heat-joining step is typically that of a partially squashed sphere such as that shown in FIG. 1.

In use, the module is subjected to temperature variations which cause expansion and contraction of the chip and substrate. The difference in expansion of the chip and substrate results in shear stress being placed on the interconnector joints. The cyclic nature of the stress placed on the interconnector joints causes a fracture in the interconnector joints thereby impairing the electrical connection between chip and substrate.

The present invention is concerned with the ability of the interconnectors to withstand the shear stress placed on them. Particularly, it has been found that there are significant advantages to be achieved, particularly the increased lifetime of the modules, if the interconnecting joints are designed so that they are not all alike, i.e., they do not all have the same ability to resist shear stress. The term "shear resistivity" is used herein to designate the relative ability of an interconnecting joint to withstand shear stress, particularly cyclic shear stress, without fracturing.

Figure 2:
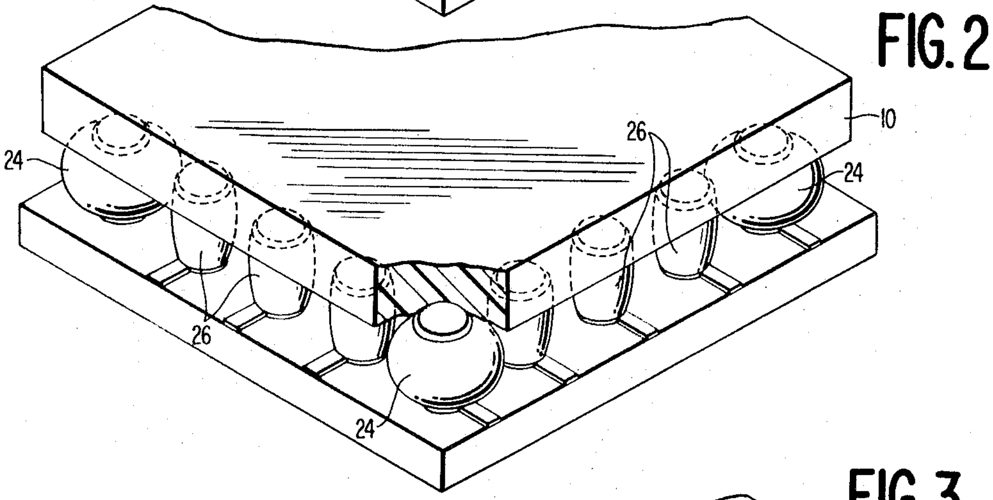
FIG. 2 is a planned view of a chip substrate module having larger volume outer connectors.

In accordance with one embodiment of the present invention, shown in FIG. 2, the volume of the four corner connectors is increased. The increased volume of the solder tends to increase standoff, i.e., increase the distance between chip and substrate. This causes a "stretching out" or elongation of the other interconnection joints. The corner interconnection joints now have a different stress resistance than the intermediate joints. The increased volume of the corner pads will increase the stress resistance of the other pads, but the stress resistance of the corner pads will be decreased. As an example, assuming uniform BLM size and finger size, the volume ratio of 2:1 will provide a module in which the fatter corner pads have a lower stress resistivity than the thinner inner pads. That means that given the identical stress conditions, the corner pads will fracture first.

The module will have a neutral point which is determined by the positions of all the interconnecting joints. As a simple example, a module having all interconnecting joints on the periphery of a circle will have a neutral point at the center of the circle. Expansion takes place from the neutral point and consequently the greater the distance from the neutral point, the greater the stress placed on the joint. For the arrangement shown in FIGS. 1 and 2, the corner pads would experience the greatest stress and would be the first to fracture if the stress resistivity of all joints is the same. In FIG. 2, the stress resistivity of the corner joints is less than that of the inner joints. However, the fatter corner joints could be dummy joints, i.e., provide mechanical interconnection but not connected to any active or passive element in the chip. Under these circumstances, the advantages of increased stress resistance of the electrical interconnection joints (inner joints) is achieved. The fact that the corner joints will fracture sooner than in the case of FIG. 1 is not a detriment because the impairment of the electrical connection is of no consequence in a dummy joint.

It should be noted that the thinner or more uniform shape of the interconnector pad means an increase in its ability to withstand stress. This is due to a more uniform strain distribution throughout the interconnection. Typically, as pointed out above, the lower volume joints will have a more uniform shape and will have a greater stress resistance. However, it should be noted that in an extreme case, the difference in volumes and the number of joints at the respective volumes could be such that the lower volume joints will be so stretched out that a more uniform strain distribution and consequently a greater stress resistivity will occur in the larger volume joints. The important feature, however, that there is a difference in stress resistivity among interconnecting joints, is not impaired by this extreme case.

Figure 3:
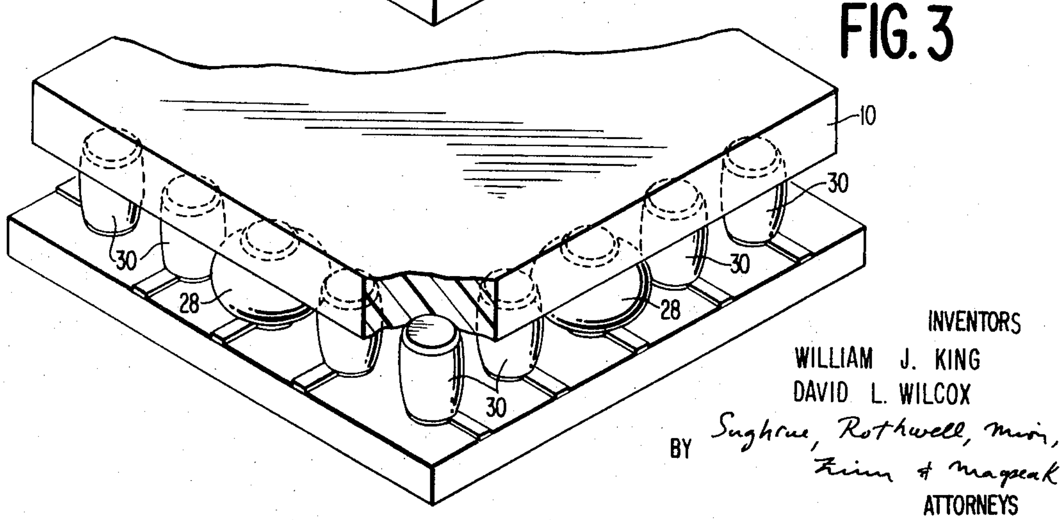
FIG. 3 is a planned view of a chip substrate module having larger volume inner connectors.

In the embodiment shown in FIG. 3, the interconnecting joints 28 having the lower stress resistivity are the inner joints. The outer joints 30 have an increased stress resistivity. Thus, those joints which are subject to the greatest stress have the greatest ability to withstand stress at the expense of those joints which are subject to a lesser stress. In this case, there is no need for the fatter joints to be dummy joints, all can be electrically active (i.e., connected to a passive or active element in the chip 10) with the consequence being an increased lifetime over the uniform stress resistivity module of FIG. 1.

One other method of varying the stress resistance of joints in a module is to vary the solder wettable area of the connector regions on the substrate, such as shown in FIGS. *4a* and *4b*. FIG. *4a* shows the module including chip 40, substrate 42 and interconnecting joints 76–84. FIG. *4b* is a top view of the substrate 42 and illustrates the relative sizes of the connector regions.

In FIGS. 4*a* and 4*b*, the difference in shape and therefore the difference in stress resistivity between the fat joints 82,84 and the thin joints 76,78,80 is not due to a difference in volume but due to a difference in size of the connector regions. A smaller connector region, such as those shown at 62, 66, 70, and 74, causes the solder joint to bulge out and assume a fatter shape. The larger connector regions 60, 64, 68 and 72 result in a solder interconnection joint having a thinner shape. The difference in shape means a difference in stress resistivity. As shown in the drawing, the outer joints, having the narrower cross section at the middle thereof, are subject to the greater amount of stress and are more able to withstand the stress than the inner fatter joints.

The size of the connector regions may be limited by placing glass barriers across the fingers at appropriate spots or by using a non-wettable metal for the extended part of the fingers such as taught in the above mentioned patent to Miller. It will also be noted that the glass barrier or dams could be continuous for an entire side of the substrate or for all four sides thereof.

As in the case for volume variation, described above, it is not always the case that a smaller connector region on the substrate decreases the stress resistance of the solder interconnector. Because of the relative number of the large and small connector regions and the difference in size of these regions, along with the volume amount and the BLM size, the fatter interconnection joints may have a more uniform strain distribution than the thinner joints.

Another way in which variation of the joint geometry and concomitantly variation in the stress resistance can be achieved is by a variation in the size of the BLM on the chip.

Additionally, variation in the stress resistance can be achieved by varying the material of the interconnectors, such as shown in FIG. 5. There, the joints 100, 102 and 104 are solder whereas the connectors 106 and 108 are copper ball connectors. Solder, being a relatively ductile and flexible material, has a greater stress resistivity than the more rigid copper ball interconnectors. However, the copper ball, being rigid, is better at providing standoff between chip and substrate. With both types of joints used in the same module, the rigid lower streess resistivity copper ball joints should be placed nearer the neutral point than the solder joints, or should be used as dummy joints. In the upper ball joint, the ball itself is mechanically connected to the BLM and the conductive finger by small amounts of solder 105 and 107.

In each of the embodiments shown above, there are two groups of interconnecting joints per module, each group having a different stress resistivity because of a difference in material (FIG. 5) or a difference in geometry (FIGS. 2–4), the latter difference being brought about by differences in volume, wettable finger size, or BLM size. However, it is not necessary to limit the stress resistance variation for a module to two classes. An optimum design would be for each interconnection joint to have a stress resistance dependent upon the distance of the joint from the neutral point. In such a case, theoretically, all joints would fracture at the same time because the stress is also dependent on the distance from the neutral point.

It can be intuitively appreciated that, since the solder goes into a molten state during the heat-joining step, and the surface tension holds the solder ball together, an increase in volume of all of the solder balls would raise the height between chip and substrate. Conversely, a decrease in volume would lower the height. Furthermore, for a given volume of solder, the stress resistance is partially dependent on the height. Consequently, a mere lowering of the volume of the joints furthest from the neutral point (lowered from some optimum volume for a constant volume joint chip/substrate connection) would decrease the overall distance between chip and substrate thereby at least partially offsetting any increase in stress resistance due to the volume decrease.

Since the joints nearest the neutral point experience the least stress, their volume can be increased without causing an earlier failure of the chip/substrate device. The increased volume of the inner joints offsets any standoff distance loss which would be caused by the decreased volume of the outer joints.

The optimum design would be for all joints to have stress resistance dependent on the position such that they all fail at the same time. While this is theoretically possible, it is difficult to achieve in practice. However, this condition can be approached and the fact that the stress resistance is dependent upon distance from the neutral point tends to equalize the failure time of the pads and improve the device overall. The staggering or gradation of the stress resistance of the joints can be achieved by staggering the volume, BLM or solder wettable areas.

It should be noted that differences of the stress resistivity of joints in a single module, need not be due to only one of the techniques outlined above, but can be due to any combination of techniques, i.e., varying volume, solder wettable finger size, BLM size and material.

What is claimed is:

1. In a semiconductor module formed of a chip mounted to a substrate each having first and second major surfaces the improvement comprising a plurality of solder wettable metal regions on the first major face of said chip, a first plurality of solder wettable metal regions of a first size on the first major face of said substrate, a second plurality of solder wettable metal regions of another size substantially different from the first size on said first major face of said substrate, and plural stress resistant solder means for connecting respective ones of the metal regions on said chip and substrate, whereby said connection means have a first stress resistivity or a second stress resistivity different from the first dependent on whether connection is made to one of said first or second pluralities of wettable regions on said substrate.

2. In the module as claimed in claim 1 wherein the first plurality of said solder wettable metal regions on said substrate are smaller in area than the second plurality of solder wettable metal regions on said substrate.

3. In the module as claimed in claim 2 wherein said second plurality of solder wettable metal regions are positioned near the corners of said module.

4. In the module as claimed in claim 2 wherein said first plurality of solder wettable metal regions are nearer the center of said chip than said second plurality of solder wettable metal regions.

5. In the module as claimed in claim 1 further comprising conductive metal fingers on said substrate in contact with said solder wettable regions and glass dams overlying said conductive fingers to block solder on said solder wettable regions from flowing onto said conductive fingers.

6. A semiconductor module comprising a first member having first and second major faces thereof, an electrically conductive material on portions of said first major face thereof, a second member having first and second major faces thereof, an electrically conductive pattern on said first major face of said second member including regions of wettable with solder conductive material differing in size and surrounded by non-wettable with solder material, and a plurality of stress resistant solder means for interconnecting and separating said electrically conductive material on said first member with respective ones of said surrounded solder wettable regions on said second member, whereby said solder means have differing stress resistivities dependent on which ones of said surrounded solder wettable regions connection is made to on said second member.

7. The module as claimed in claim 6 wherein said surrounded solder wettable regions further from the center of said first member are larger than said other surrounded solder wettable regions.

8. The module as claimed in claim 6 wherein all of said solder means comprise the same volume of solder and wherein said solder means contacting said smaller surrounded solder wettable regions are fatter than said solder connectors contacting said larger surrounded solder wettable regions.

* * * * *